(12) United States Patent
Tanabe

(10) Patent No.: US 7,404,157 B2
(45) Date of Patent: Jul. 22, 2008

(54) EVALUATION DEVICE AND CIRCUIT DESIGN METHOD USED FOR THE SAME

(75) Inventor: Akira Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 382 days.

(21) Appl. No.: 10/540,973

(22) PCT Filed: Dec. 25, 2003

(86) PCT No.: PCT/JP03/16804

§ 371 (c)(1),
(2), (4) Date: Jun. 27, 2005

(87) PCT Pub. No.: WO2004/059333

PCT Pub. Date: Jul. 15, 2004

(65) Prior Publication Data

US 2006/0107241 A1    May 18, 2006

(30) Foreign Application Priority Data

Dec. 25, 2002    (JP)    .............................. 2002-373349

(51) Int. Cl.
*G06F 17/50*    (2006.01)
(52) U.S. Cl. .............................. 716/4; 716/1; 257/347; 257/611
(58) Field of Classification Search .................. 716/2, 716/4, 1; 257/347, 611
See application file for complete search history.

(56) References Cited

U.S. PATENT DOCUMENTS

| | | | | |
|---|---|---|---|---|
| 4,241,316 A | * | 12/1980 | Knapp | ........................ 330/277 |
| 4,361,797 A | * | 11/1982 | Kojima et al. | ................ 323/316 |
| 4,683,435 A | * | 7/1987 | Blades | ........................ 324/442 |
| 5,283,726 A | * | 2/1994 | Wilkerson | ..................... 363/41 |
| 5,317,275 A | * | 5/1994 | Mount et al. | ................. 324/692 |
| 5,420,055 A | * | 5/1995 | Vu et al. | ....................... 438/162 |
| 5,453,923 A | * | 9/1995 | Scalais et al. | ................. 363/53 |
| 5,504,430 A | * | 4/1996 | Andersson | ................... 324/439 |
| 5,578,865 A | * | 11/1996 | Vu et al. | ..................... 257/611 |
| 5,917,333 A | * | 6/1999 | Ogawa | ........................ 324/769 |
| 5,940,261 A | * | 8/1999 | Bagna et al. | ................. 361/150 |
| 5,990,741 A | * | 11/1999 | Yamamoto et al. | .......... 330/253 |

(Continued)

FOREIGN PATENT DOCUMENTS

JP        5-166909        7/1993

(Continued)

*Primary Examiner*—Paul Dinh
*Assistant Examiner*—Suchin Parihar
(74) *Attorney, Agent, or Firm*—Young & Thompson

(57) ABSTRACT

There is provided an evaluation apparatus capable of measuring the I-V characteristic in the MOSFET AC operation with a high accuracy. There are also provided a circuit design method and a circuit design system used for the evaluation apparatus. In the evaluation apparatus (1), an AC input signal superimposing circuit (11) applies DC voltage to the MOSFET gate•source•drain•substrate and superimposes an AC input signal of very small voltage on the gate. An AC component measurement circuit (12) measures an AC component of the current flowing between the source and the drain at that time. A mutual conductance calculation circuit (13) compares the amplitude of the AC component of the current with the amplitude of the AC input signal and calculates, from this ratio, the mutual conductance in the frequency of the AC input signal of the MOSFET.

26 Claims, 17 Drawing Sheets

U.S. PATENT DOCUMENTS

| | | | |
|---|---|---|---|
| 6,295,630 B1 * | 9/2001 | Tamegaya | 716/4 |
| 6,734,501 B2 * | 5/2004 | Sugano et al. | 257/347 |
| 6,991,948 B2 * | 1/2006 | Hillard | 438/17 |
| 7,132,703 B2 * | 11/2006 | Hikita et al. | 257/280 |
| 2004/0133862 A1 * | 7/2004 | Naruta et al. | 716/4 |
| 2004/0189388 A1 * | 9/2004 | Nguyen et al. | 330/254 |

FOREIGN PATENT DOCUMENTS

| | | |
|---|---|---|
| JP | 6-266789 | 9/1994 |
| JP | 7-6599 | 1/1995 |
| JP | 11-154696 | 6/1999 |
| JP | 2002-214279 | 7/2002 |

\* cited by examiner

EVALUATION DEVICE AND CIRCUIT DESIGN METHOD USED FOR THE SAME

FIELD OF THE INVENTION

The present invention relates to an evaluation apparatus, and a circuit design method and a circuit design system thereof, and, more particularly to the evaluation apparatus, and the circuit design method and the circuit design system thereof for SOI (Silicon on Insulator) MOSFET (Metal Oxide Semiconductor Field Effect Transistor).

BACKGROUND OF THE INVENTION

All of patents, patent applications, patent publications, scientific articles and the like, which will hereinafter be cited or identified in the present application, will hereby be incorporated by references in their entirety in order to describe more fully the state of the art, to which the present invention pertains.

In a SOI MOSFET, it is well known that On-current (current at ON) changes depending on its operation history by a history effect. Therefore, it is necessary to know a dynamic I-V characteristic as well as a DC I-V characteristic for the SOI MOSFET.

Conventionally, a pulse measurement method as shown in FIG. 1 has been used for measuring the dynamic I-V characteristic. In FIG. 1, the source of MOSFET 105 is grounded, the drain is connected to a power source through inductive load (L1) 121, and also to oscilloscope 120 through a capacitive element (C1). In addition, pulse generator 119 is connected to the gate.

If a square wave is inputted into MOSFET 105 from pulse generator 119, a current flowing in inductive load (L1) 121 changes according to a change of drain current of MOSFET 105, thereby resulting in change of a drain voltage. The change of the drain voltage is measured by oscilloscope 120. If a characteristic of inductive load (L1) 121 is known, a change of the drain current can be obtained from the change of the drain voltage. A relation between amplitude of the inputted square wave and the drain current constitutes the I-V characteristic during pulse input. This has been disclosed in, for example, IEEE Electron Device Letters, Vol. 16, No. 4, p145, 1995.

Other than the above measurement method, there exists a method called a drain conductance method as shown in FIG. 2. In this method, an impedance analyzer is connected to the source and the drain, while applying a DC voltage to the gate, and a differential conductance $g_D$ between the source and the drain is measured by applying an AC signal. If the differential conductance $g_D$ is integrated by the drain voltage, the I-V characteristic at a frequency of the AC signal can be obtained. This has been disclosed in, for example, IEEE Journal of Solid-State Circuit, Vol. 27, No. 8, p1186, 1992.

For designing a circuit of SOI MOSFET, SOI-enabled SPICE (circuit simulator) parameters, for example, BSIM SOI is used. For extracting the parameters, a value of a DC I-V measurement is used. This has been disclosed in, for example, BSIM PD2.1 MOSFET MODEL Users Manual BSIM Research Group 1999.

Voltage is measured with an oscilloscope in the pulse measurement method. However, since the voltage dissolution of the oscilloscope is low compared with that of a DC current meter and a DC voltage meter, an accuracy of the measured voltage is low. In addition, since various frequency signals are included in the square signal, it is impossible to obtain the I-V characteristic at a specified frequency.

The drain conductance method has a higher accuracy than the pulse measurement method because of the use of impedance analyzer. However, since the measurement is conducted at a constant gate voltage, the I-V characteristic is different from that of a practical operation of the MOSFET. Then, there exists a problem that the dynamic I-V characteristic at the practical operation of the MOSFET can not be obtained.

Furthermore, since the dynamic I-V characteristic at the practical MOSFET operation is not known, a parameter fitting for the dynamic I-V characteristic is not implemented at SOI-enabled SPICE parameter extraction.

DISCLOSURE OF THE INVENTION

It is therefore an object of the present invention to provide an evaluation apparatus which can solve the above issues, and can accurately measure an I-V characteristic of the MOSFET, especially of the SOI MOSFET at AC operation.

It is another object of the present invention to provide a circuit design method which can solve the above issues, and can accurately measure the I-V characteristics of the MOSFET, especially of the SOI MOSFET at AC operation.

It is a further object of the present invention to provide a circuit design system which can solve the above issues, and can accurately measure the I-V characteristics of the MOSFET, especially of the SOI MOSFET at AC operation.

According to the first aspect of the present invention, the present invention provides an evaluation apparatus comprising: an AC input signal superimposing circuit for superimposing an AC input signal to a gate of a MOSFET (Metal Oxide Semiconductor Field Effect Transistor); an AC component measurement circuit for measuring an AC component of a current flowing between a source and a drain of the MOSFET when the AC input signal is superimposed to the gate; and a mutual conductance calculation circuit for calculating a mutual conductance at a frequency of the AC input signal of the MOSFET from a ratio of amplitude of an AC component of a measured current and amplitude of the AC input signal, wherein the gate, the source, and the drain of the MOSFET are being applied a DC voltage. The AC input signal in the above is a very small voltage.

The evaluation apparatus according to the present invention superimposes the AC input signal of a small voltage to the gate, measures an AC component of the current flowing between the source and the drain at the time, and calculates a mutual conductance at a frequency of the AC input signal of the MOSFET from a ratio between amplitude of AC component of the current and amplitude of the AC input signal. The MOSFET at here is a SOI (Silicon On Insulator) MOSFET having a SOI structure.

The evaluation apparatus according to the present invention may further comprise a drain current calculation circuit for calculating a drain current at around a frequency of the AC input signal by measuring the mutual conductance by sweeping a gate voltage and integrating the mutual conductance by the gate voltage.

In addition, the evaluation apparatus according to the present invention may further comprise an AC component amplitude calculation circuit for calculating an amplitude of an AC component of a body voltage under a condition of the AC input signal being inputted from a ratio of a mutual conductance of the SOI MOSFET at a frequency of the AC input signal and a mutual conductance of the SOI MOSFET at DC without superimposing the AC input signal, and from a relation between the body voltage of the SOI MOSFET and a threshold value.

In addition, the evaluation apparatus according to the present invention may further comprise a circuit simulation unit for simulating the SOI MOSFET; a comparator circuit for comparing a gate•source•drain voltage dependency of a frequency characteristic of the mutual conductance obtained from the mutual conductance calculation circuit as a result of measurement of the MOSFET with a gate•source•drain voltage dependency of a frequency characteristic of the mutual conductance obtained as a result of circuit simulation for simulating the MOSFET; and a parameter control circuit for changing a parameter which is used for the circuit simulation so that a frequency characteristic of the mutual conductance obtained as a result of the circuit simulation approaches to a frequency characteristic of the mutual conductance obtained from a result of measurement of the MOSFET.

In addition, according to the evaluation apparatus of the present invention, it is favorable that a measurement of the mutual conductance is conducted under a bias condition that the gate voltage is within ±0.5 V of a threshold value of the MOSFET.

In addition, it is also favorable that the AC input signal superimposing circuit superimposes the AC input signal to the gate under a condition of applying the DC voltage to the substrate as well as the gate, the source, and the drain.

According to the second aspect of the present invention, the present invention provides an evaluation apparatus, comprising: an AC input signal superimposing circuit for superimposing an AC input signal to a drain of a SOI (Silicon On Insulator) MOSFET (Metal Oxide Semiconductor Field Effect Transistor); an AC component measurement circuit for measuring an AC component of a current flowing between a source and a drain of the SOI MOSFET when the AC input signal is superimposed to the drain; and a drain conductance calculation circuit for calculating a drain conductance at a frequency of the AC input signal of the SOI MOSFET from a ratio of amplitude of an AC component of a measured current and amplitude of the AC input signal, wherein the gate, the source, and the drain of the SOI MOSFET are being applied a DC voltage. In the above, the AC input signal is a very small voltage.

The evaluation apparatus according to the present invention may further comprise an AC component amplitude calculation circuit for calculating amplitude of an AC component of a body voltage under a condition of the AC input signal being inputted from a ratio of a drain conductance at a frequency of the AC input signal and a drain conductance of the SOI MOSFET at DC without superimposing the AC input signal, and a relation between the body voltage of the SOI MOSFET and a threshold value.

In addition, the evaluation apparatus according to the present invention may further comprise a circuit simulation unit for simulating the SOI MOSFET; a comparator circuit for comparing a gate•source•drain voltage dependency of a frequency characteristic of the drain conductance obtained from the drain conductance calculation circuit as a result of measurement of the MOSFET with a gate•source•drain voltage dependency of a frequency characteristic of the drain conductance obtained as a result of circuit simulation for simulating the MOSFET; and a parameter control circuit for changing a parameter which is used for the circuit simulation so that a frequency characteristic of the drain conductance obtained as a result of the circuit simulation approaches to a frequency characteristic of the drain conductance obtained from a result of measurement of the MOSFET.

In addition, according to the evaluation apparatus of the present invention, it is favorable that a measurement of the drain conductance is conducted under a bias condition that an absolute value of the gate voltage is within 0.5 V.

In addition, according to the evaluation apparatus of the present invention, it is also favorable that the AC input signal superimposing circuit superimposes the AC input signal to the gate under a condition of applying the DC voltage to the substrate as well as the gate, the source, and the drain.

According to the third aspect of the present invention, the present invention provides a circuit design method, comprising a step for superimposing an AC input signal to a gate of a MOSFET (Metal Oxide Semiconductor Field Effect Transistor); a step for measuring an AC component of a current flowing between a source and a drain of the MOSFET when the AC input signal is superimposed to the gate; a step for calculating a mutual conductance at a frequency of the AC input signal of the MOSFET from a ratio of amplitude of an AC component of a measured current and amplitude of the AC input signal; a step for comparing a gate•source•drain voltage dependency of a frequency characteristic of the mutual conductance obtained as a result of measurement of the MOSFET with a gate•source•drain voltage dependency of a frequency characteristic of the mutual conductance obtained from circuit simulation for simulating the MOSFET; and a step for changing a parameter which is used for the circuit simulation so that a frequency characteristic of the mutual conductance obtained as a result of the circuit simulation approaches to a frequency characteristic of the mutual conductance obtained from a result of measurement of the MOSFET, wherein the gate, the source, and the drain of the MOSFET are being applied a DC voltage. In the above, the AC input signal is a very small voltage, and the MOSFET is a SOI (Silicon On Insulator) MOSFET having a SOI structure. The parameter is at least one of capacitances and resistors between a body of the MOSFET and the gate•source•drain•substrate.

It is favorable that the step for superimposing the AC input signal superimposes the AC input signal to the gate under a condition of applying the DC voltage to the substrate as well as the gate, the source, and the drain.

According to the fourth aspect of the present invention, the present invention provides a circuit design method, comprising a step for superimposing an AC input signal to a drain of a SOI (Silicon On Insulator) MOSFET (Metal Oxide Semiconductor Field Effect Transistor); a step for measuring an AC component of a current flowing between a source and a drain of the SOI MOSFET when the AC input signal is superimposed to the drain; a step for calculating a drain conductance at a frequency of the AC input signal of the SOI MOSFET from a ratio of amplitude of an AC component of a measured current and amplitude of the AC input signal; a step for comparing a gate•source•drain voltage dependency of a frequency characteristic of the drain conductance obtained as a result of measurement of the MOSFET with a gate•source•drain voltage dependency of a frequency characteristic of the drain conductance obtained from circuit simulation for simulating the SOI MOSFET; and a step for changing a parameter which is used for the circuit simulation so that a frequency characteristic of the drain conductance obtained as a result of the circuit simulation approaches to a frequency characteristic of the drain conductance obtained from a measurement result of the MOSFET, wherein the gate, the source, and the drain of the SOI MOSFET are being applied a DC voltage. In the above, the AC input signal is a very small voltage, and the parameter is at least one of capacitances and resistors between a body of the SOI MOSFET and the gate•source•drain•substrate. It is favorable that the step for superimposing the AC input signal superimposes the AC input signal to the gate under a condition of applying the DC voltage to the substrate as well as the gate, the source, and the drain.

According to the fifth aspect of the present invention, the present invention provides a circuit design system, comprising a function block for superimposing an AC input signal to a gate of a MOSFET (Metal Oxide Semiconductor Field Effect Transistor); a function block for measuring an AC component of a current flowing between a source and a drain of the MOSFET when the AC input signal is superimposed to the gate; a function block for calculating a mutual conductance at a frequency of the AC input signal of the MOSFET from a ratio of amplitude of an AC component of a measured current and amplitude of the AC input signal; a function block for comparing a gate•source•drain voltage dependency of a frequency characteristic of the mutual conductance obtained as a result of measurement of the MOSFET with a gate•source•drain voltage dependency of a frequency characteristic of the mutual conductance obtained from circuit simulation for simulating the MOSFET; and a function block for changing a parameter which is used for the circuit simulation so that a frequency characteristic of the mutual conductance obtained as a result of the circuit simulation approaches to a frequency characteristic of the mutual conductance obtained from a result of measurement of the MOSFET, wherein the gate, the source, and the drain of the MOSFET are being applied a DC voltage. In the above, the AC input signal is a very small voltage, and the MOSFET is a SOI MOSFET having a SOI (Silicon On Insulator) structure. The parameter is at least one of capacitances and resistors between a body of the SOI MOSFET and the gate•source•drain•substrate. It is favorable that the function block for superimposing the AC input signal superimposes the AC input signal to the gate under a condition of applying the DC voltage to the substrate as well as the gate, the source, and the drain.

According to the sixth aspect of the present invention, the present invention provides a circuit design system, comprising a function block for superimposing an AC input signal to a drain of a SOI (Silicon On Insulator) MOSFET (Metal Oxide Semiconductor Field Effect Transistor); a function block for measuring an AC component of a current flowing between a source and a drain of the SOI MOSFET when the AC input signal is superimposed to the drain; a function block for calculating a drain conductance at a frequency of the AC input signal of the SOI MOSFET from a ratio of amplitude of an AC component of the measured current and amplitude of the AC input signal; a function block for comparing a gate•source•drain voltage dependency of a frequency characteristic of the drain conductance obtained as a result of measurement of the MOSFET with a gate•source•drain voltage dependency of a frequency characteristic of the drain conductance obtained by circuit simulation for simulating the SOI MOSFET; and a function block for changing a parameter which is used for the circuit simulation so that a frequency characteristic of the drain conductance obtained as a result of the circuit simulation approaches to a frequency characteristic of the drain conductance obtained from a result of measurement of the MOSFET, wherein the gate, the source, and the drain of the SOI MOSFET are being applied a DC voltage. In the above, the AC input signal is a very small voltage. The parameter is at least one of capacitances and resistors between a body of the SOI MOSFET and the gate•source•drain•substrate. The function block for superimposing the AC input signal superimposes the AC input signal to the gate under a condition of applying the DC voltage to the substrate as well as the gate, the source, and the drain.

As described in the above, according to the present invention, it becomes possible to accurately measure a I-V characteristic which is close to the practical operation by measuring the I-V characteristic when the AC signal is inputted on the gate or the drain. In addition, according to the present invention, it becomes possible to accurately measure a dynamic change of the body voltage from the dynamic I-V characteristic of the SOI MOSFET. Furthermore, it becomes possible to obtain a SPICE parameter which is able to truly reproduce the dynamic I-V characteristic by comparing the dynamic I-V characteristic with an I-V characteristic forecasted by the SPICE parameter.

PREFERRED EMBODIMENTS OF THE PRESENT INVENTION

Figure 3:
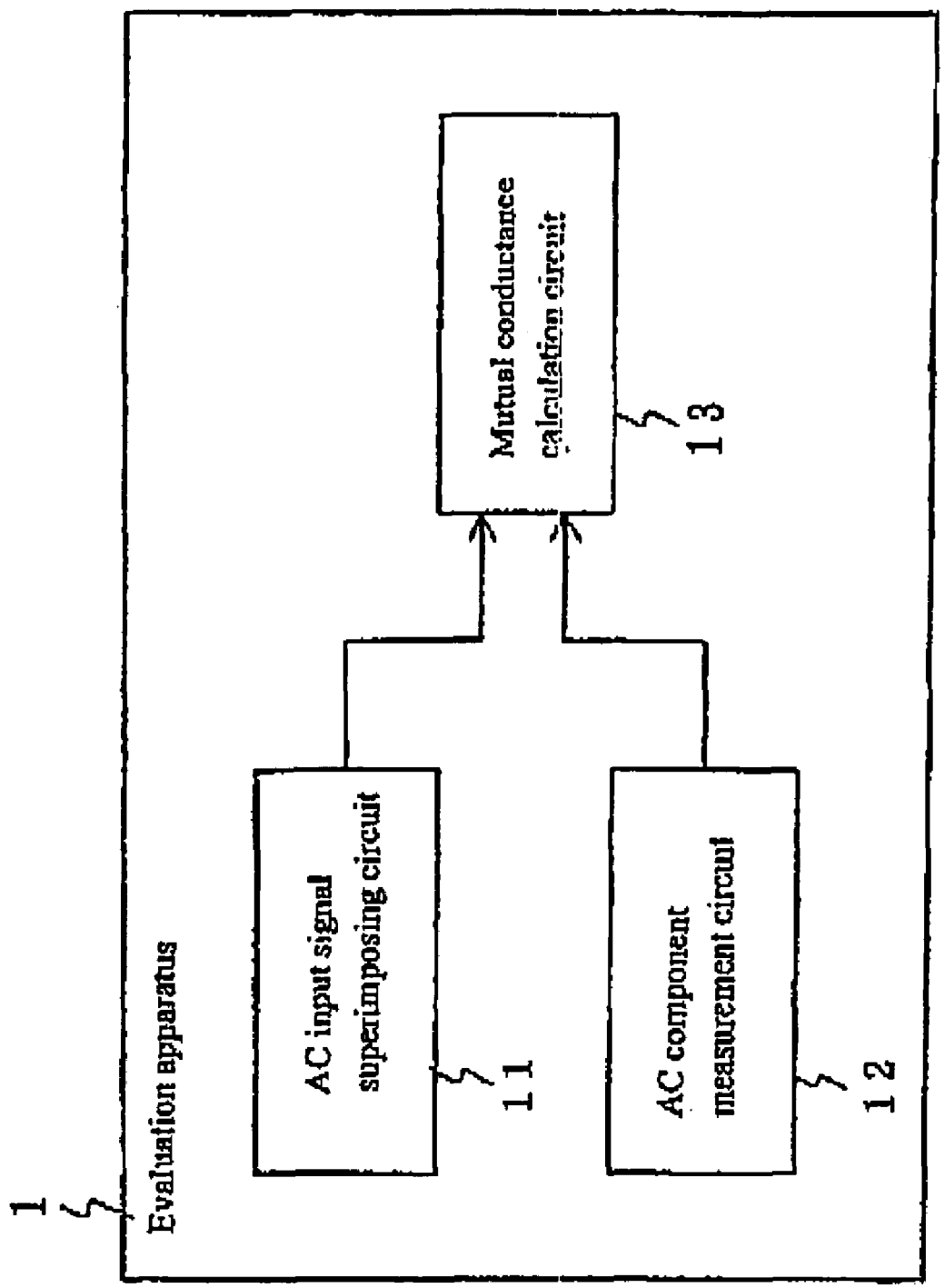
FIG. 3 is a block diagram showing a configuration of an evaluation apparatus according to a first embodiment of the present invention.

Next, embodiments of the present invention will be explained by referring to figures. FIG. 3 is a block diagram showing a configuration of an evaluation apparatus according to a first embodiment of the present invention.

In FIG. 3, evaluation apparatus 1 consists of AC input signal superimposing circuit 11, AC component measurement circuit 12, and mutual conductance calculation circuit 13.

Figure 4:
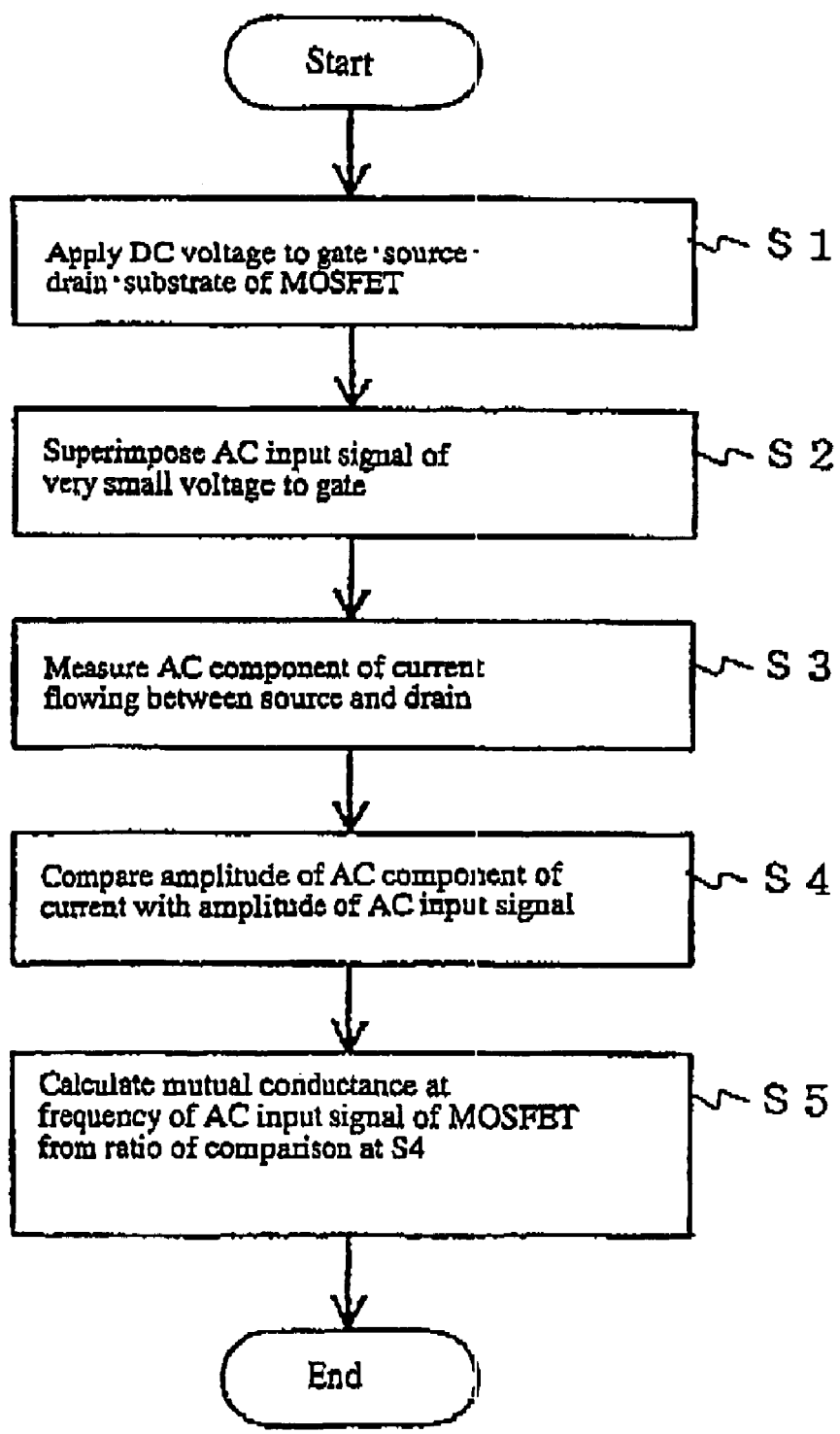
FIG. 4 is a flowchart showing operation of an evaluation apparatus according to the first embodiment of the present invention.

FIG. 4 is a flowchart showing an operation of an evaluation apparatus according to the first embodiment of the present invention. The operation of evaluation apparatus 1 according to the embodiment of the present invention will be explained by referring to FIG. 3 and FIG. 4.

In evaluation apparatus 1, AC input signal superimposing circuit 11 applies a DC voltage (step S1 in FIG. 4) to a gate•source•drain•substrate of a MOSFET (Metal Oxide Semiconductor Field Effect Transistor), and also superimposes an AC input signal of small voltage to the gate (step S2 in FIG. 4).

AC component measurement circuit 12 measures an AC component of a current flowing between the source and drain at the time (step S3 in FIG. 4), and mutual conductance calculation circuit 13 compares amplitude of the AC component of the current with amplitude of the AC input signal (step S4 in FIG. 4). From a ratio of the above comparison, a mutual conductance at a frequency of the AC input signal of the MOSFET is calculated (step S5 in FIG. 4).

Figure 5:
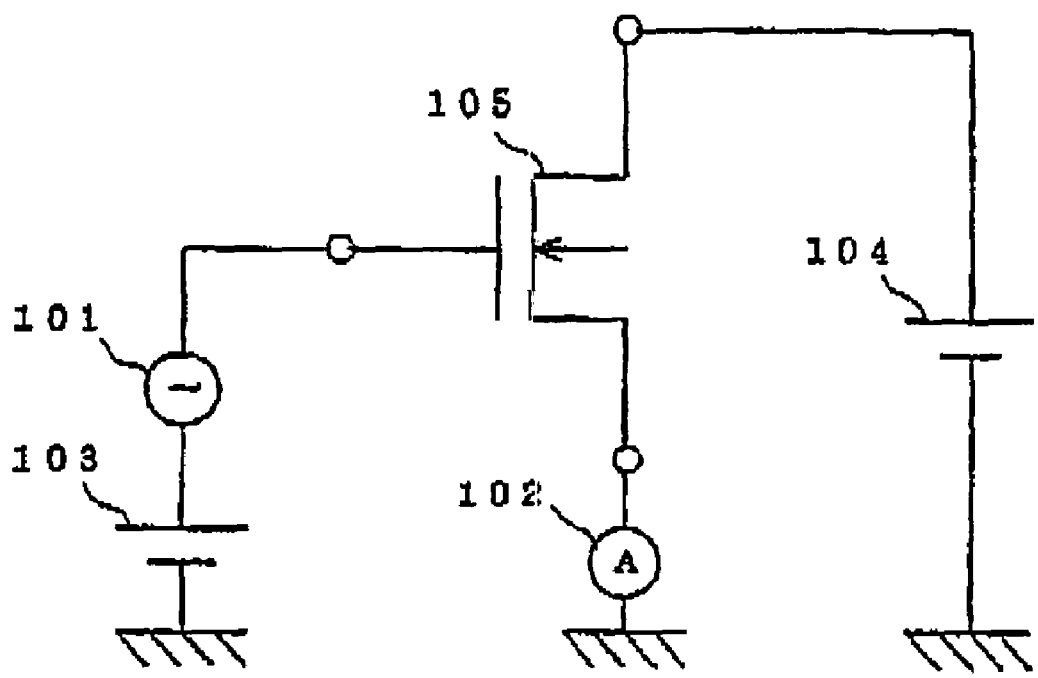
FIG. 5 is a circuit diagram showing a circuit configuration of an evaluation apparatus according to the first embodiment of the present invention.

FIG. 5 is a circuit diagram showing a circuit configuration of an evaluation apparatus according to the first embodiment of the present invention. In FIG. 5, in the evaluation apparatus according to the first embodiment of the present invention, a voltage source connecting AC voltage source 101 and DC voltage source 103 in series is connected to a gate terminal of MOSFET 105, while applying a constant voltage to a drain terminal of MOSFET 105 made of a nMOS (Metal Oxide Semiconductor) or a pMOS using DC voltage source 104, and a terminal of the opposite side of the voltage source is connected to the ground.

In addition, in the evaluation apparatus according to the embodiment of the present invention, an input terminal of AC current meter 102 is connected to a source terminal of MOSFET 105, and a terminal of the opposite side of AC current meter 102 is connected to the ground. If a ratio of measurement value of AC current meter 102 and amplitude of AC voltage source 101 is calculated under this condition, a value of the ratio constitutes a mutual conductance of MOSFET 105 at a frequency of the AC signal.

Figure 6:
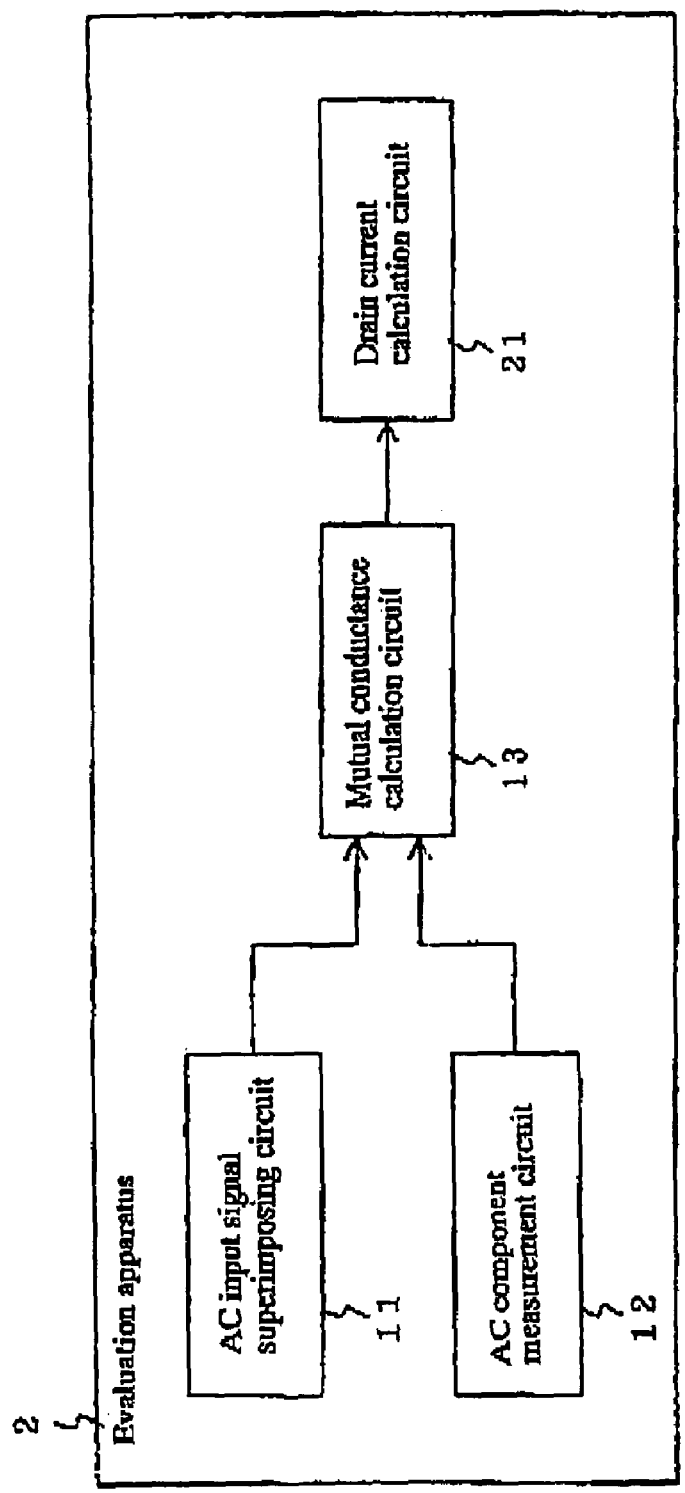
FIG. 6 is a block diagram showing a configuration of an evaluation apparatus according to the second embodiment of the present invention.

FIG. 6 is a block diagram showing a configuration of an evaluation apparatus according to a second embodiment of the present invention. In FIG. 6, evaluation apparatus 2 according to the second embodiment of the present invention has a similar configuration to evaluation apparatus 1 according to the first embodiment of the present invention except adding drain current calculation circuit 21, and it has the same symbol as evaluation apparatus 1 for the identical configuration element.

Figure 7:
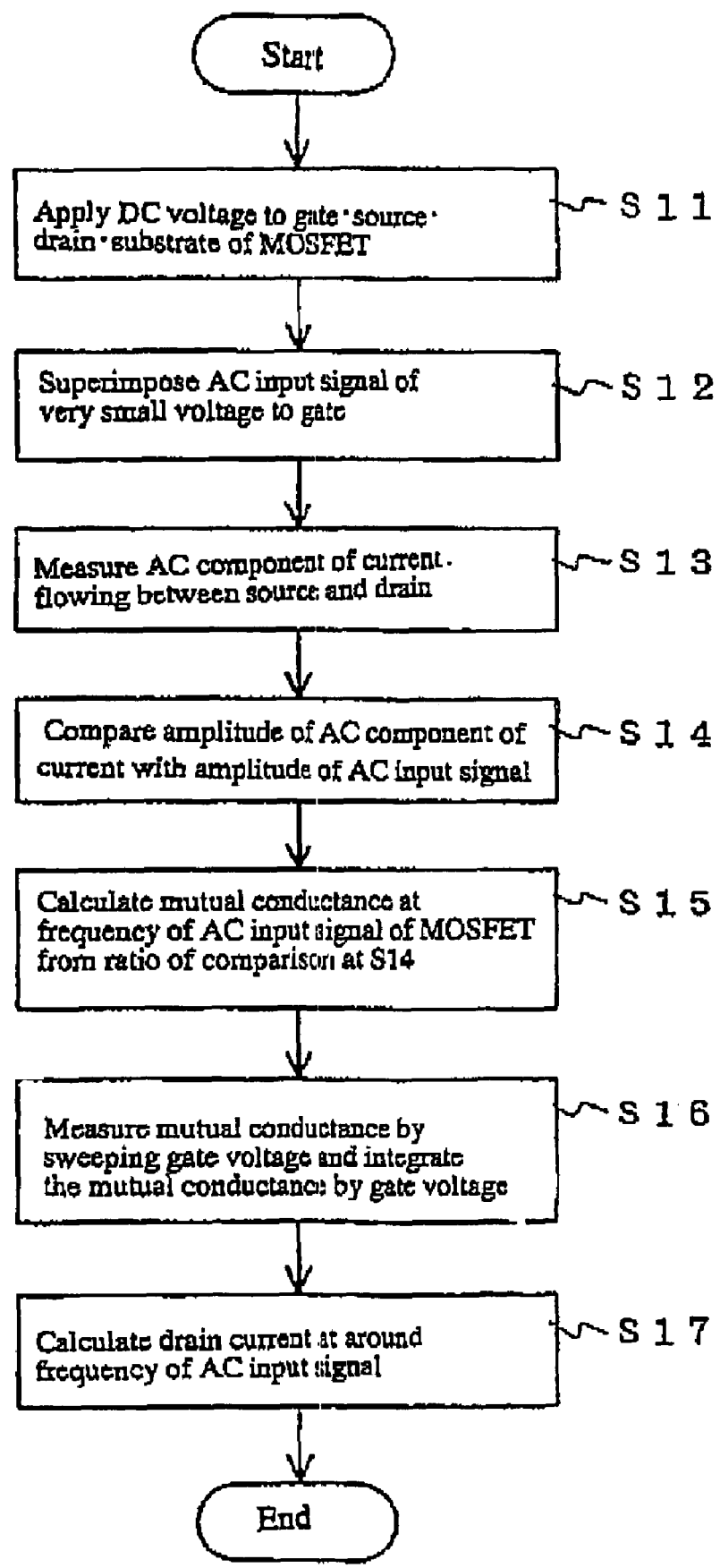
FIG. 7 is a flowchart showing operation of an evaluation apparatus according to the second embodiment of the present invention.

FIG. 7 is a flowchart showing an operation of an evaluation apparatus according to the second embodiment of the present invention.

The operation of the evaluation apparatus according to the second embodiment of the present invention will be explained by referring to FIG. 6 and FIG. 7.

In evaluation apparatus 2, AC input signal superimposing circuit 11 applies a DC voltage (step S11 in FIG. 7) to a gate•source•drain•substrate of a MOSFET (Metal Oxide Semiconductor Field Effect Transistor), and also superimposes an AC input signal of small voltage to the gate (step S12 in FIG. 7).

AC component measurement circuit 12 measures an AC component of a current flowing between the source and the drain at the time (step S13 in FIG. 7), and mutual conductance calculation circuit 13 compares amplitude of the AC component of the current with amplitude of the AC input signal (step S14 in FIG. 7). From a ratio of the above comparison, a mutual conductance at a frequency of the AC input signal of the MOSFET is, calculated (step S15 in FIG. 7).

Drain current calculation circuit 21 measures a mutual conductance by sweeping the gate voltage, integrates the mutual conductance by gate voltage (step S16 in FIG. 7), and obtains a drain current at around a frequency of the AC input signal (step S17 in FIG. 7).

Figure 8:
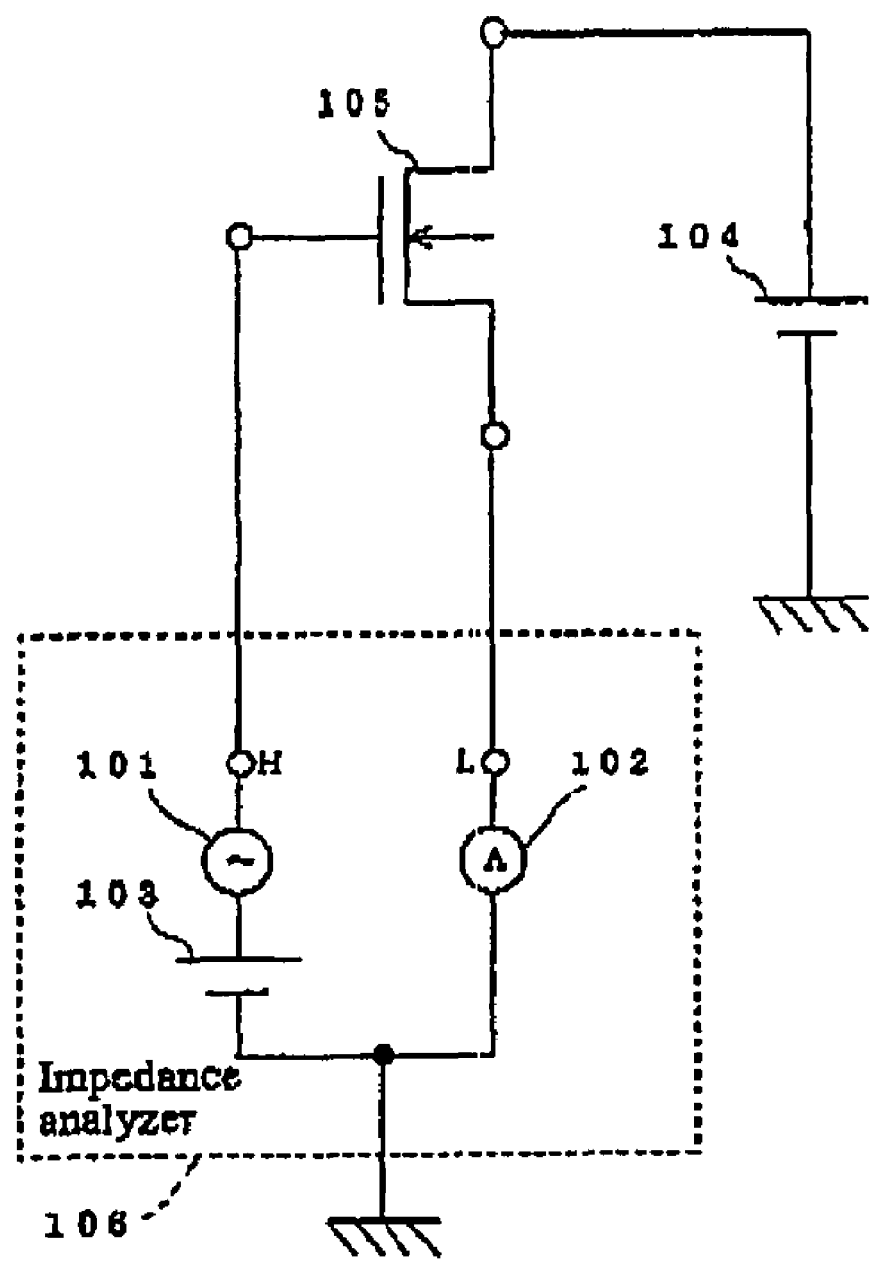
FIG. 8 is a circuit diagram showing a circuit configuration of an evaluation apparatus according to the second embodiment of the present invention.

FIG. 8 is a circuit diagram showing a circuit configuration of an evaluation apparatus according to the second embodiment of the present invention. In FIG. 8, an example of practical measurement using evaluation apparatus 2 according to the second embodiment of the present invention is shown. In impedance analyzer 106, AC voltage source 101 and DC voltage source 103 are connected to an H terminal side, and AC current meter 102 is connected to a L terminal side.

In this evaluation apparatus, the H terminal of impedance analyzer 106 is connected to the gate terminal of MOSFET 105, and the L terminal of impedance analyzer 106 is connected to the source terminal of MOSFET 105 under condition of applying a constant voltage to the drain terminal of MOSFET 105 using DC voltage source 104.

With this configuration, if amplitude of AC voltage source 101 is denoted Vg, and if amplitude of AC current meter 102 is denoted $I_S$, a mutual conductance gm(f) of MOSFET 105 at a frequency f of AC voltage source 101 is calculated from formula (1).

$$gm(f) = I_s/V_g \quad (1)$$

In formula (1), the amplitude of AC voltage source 101 must be small enough compared with DC voltage applied to the drain and the gate, for example, less than 1/10 of the DC voltage.

Figure 9:
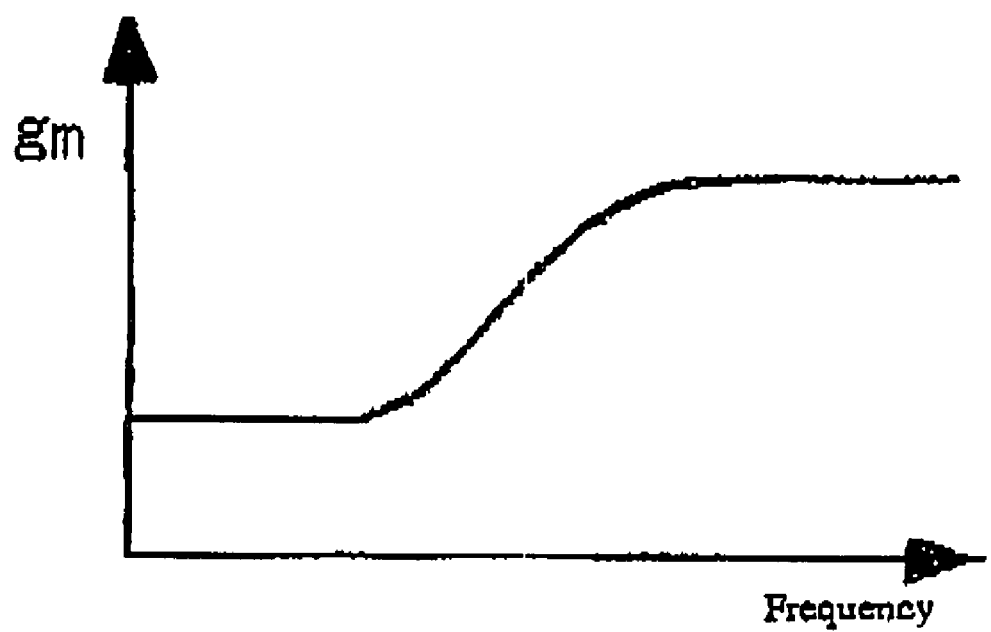
FIG. 9 is a figure showing a frequency dependency of a mutual conductance gm of a MOSFET according to one example of embodiments of the present invention.

FIG. 9 is a figure showing a frequency dependency of a mutual conductance gm of a MOSFET according to one example of embodiment of the present invention. In FIG. 9, the mutual conductance gm is a constant value against frequency at a low frequency region, increases with increase of the frequency within a specific frequency region, and becomes to be a constant value again beyond the specific frequency region.

In addition, with the configuration shown in FIG. 8, the mutual conductance gm (Vg) is measured by sweeping a voltage Vg of DC voltage source 103 in impedance analyzer 106, while fixing the drain voltage and the frequency. In this case, amplitude $i_D$ of the drain current at around a measurement frequency is expressed in formula (2) when a minimum voltage Vg0 and a maximum voltage Vg1 are inputted into the gate terminal of MOSFET 105.

$$i_D = \int_{Vg0}^{Vg1} gm(Vg) dVg \quad (2)$$

As shown in formula (2), $i_D$ can be obtained by integrating the mutual conductance gm.

A change of mutual conductance gm of SOI MOSFET as shown in FIG. 9 is due to a change of SOI body voltage in conjunction with a change of gate voltage. From a frequency dependency of the mutual conductance gm, amplitude of the body voltage is calculated by formulas (3) and (4).

$$V_{BODY}(f) = \{[\beta_{GM}(f)-1]/K_{BODY}\}V_G \quad (3)$$

$$\beta_{GM}(f) = gm(f)/gm(DC) \quad (4)$$

In the formulas, the mutual conductance gm at DC is denoted by gm(DC), a measurement value of the mutual conductance gm at frequency f is denoted by gm(f), and a body voltage dependency of a threshold value is denoted by $K_{BODY}$.

Figure 10:
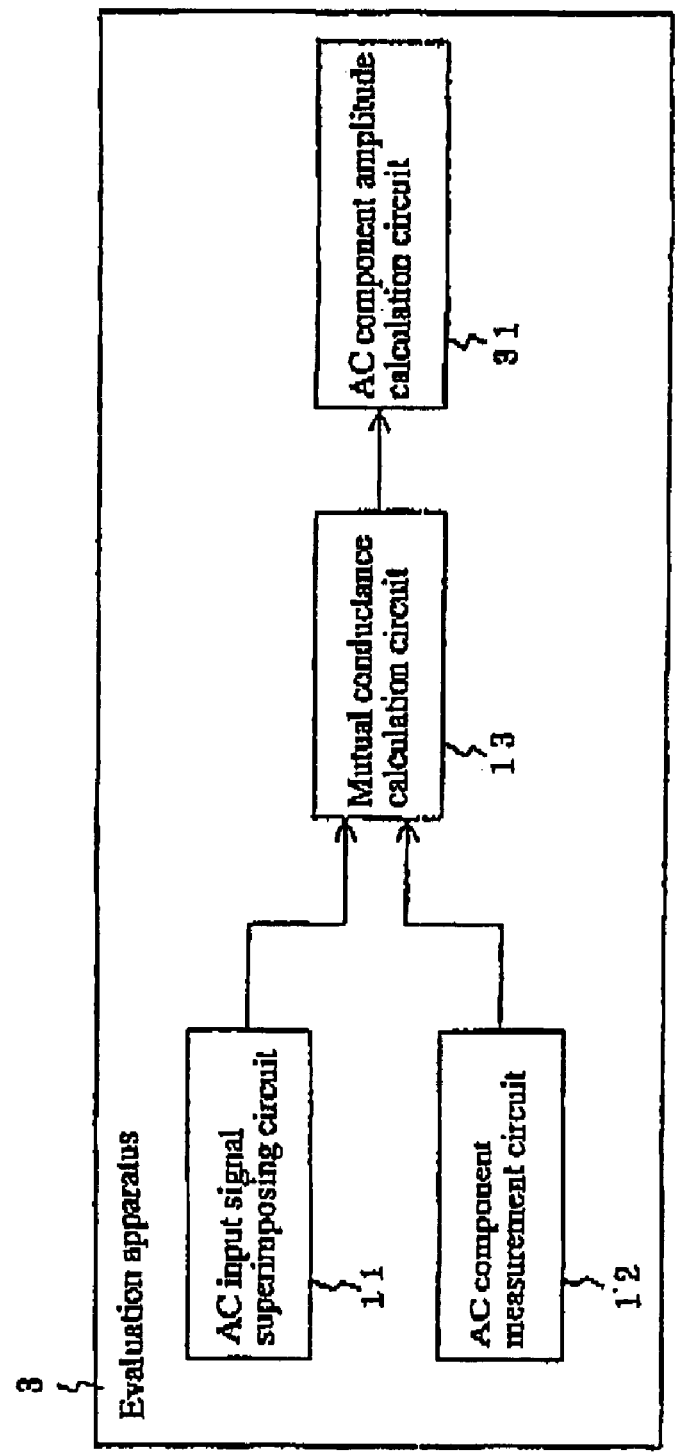
FIG. 10 is a block diagram showing a configuration of an evaluation apparatus according to the third embodiment of the present invention.

FIG. 10 is a block diagram showing a configuration of an evaluation apparatus according to a third embodiment of the present invention. In FIG. 10, evaluation apparatus 3 according to the third embodiment of the present invention has a similar configuration to evaluation apparatus 1 according to the first embodiment of the present invention except adding AC component amplitude calculation circuit 31, and it has the same symbol as evaluation apparatus 1 for the identical configuration element.

Figure 11:
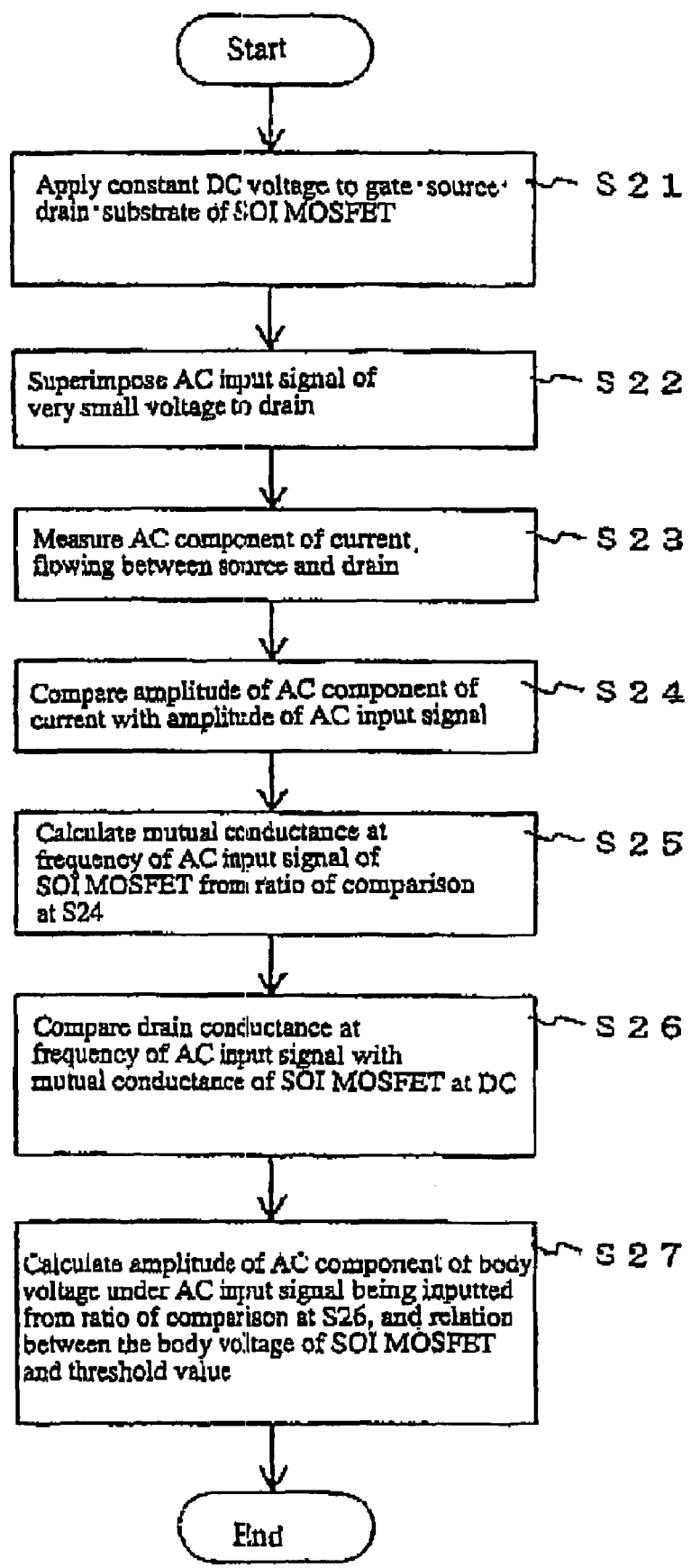
FIG. 11 is a flowchart showing operation of the evaluation apparatus according to the third embodiment of the present invention.

FIG. 11 is a flowchart showing an operation of the evaluation apparatus according to the third embodiment of the present invention. The operation of evaluation apparatus 3 according to the third embodiment of the present invention will be explained by referring to FIG. 10 and FIG. 11.

In evaluation apparatus 3, AC input signal superimposing circuit 11 applies a DC voltage (step S21 in FIG. 11) to a gate•source•drain•substrate of a MOSFET, and also superimposes an AC input signal of small voltage to the gate (step S22 in FIG. 11).

AC component measurement circuit 12 measures an AC component of a current flowing between the source and the drain at the time (step S23 in FIG. 11), and mutual conductance calculation circuit 13 compares amplitude of the AC component of the current with amplitude of the AC input signal (step S24 in FIG. 11). From a ratio of the above comparison, a mutual conductance at a frequency of the AC input signal of the MOSFET is calculated (step S25 in FIG. 11).

AC component amplitude calculation circuit 31 compares a mutual conductance at a frequency of the AC input signal with that of a SOI MOSFET at DC (step S26 in FIG. 11), and from a ratio in the above and a relation between a body voltage of the SOI MOSFET and the threshold value, an amplitude of AC component of the body voltage under the AC input signal being inputted is calculated (step S27 in FIG. 11).

Figure 12:
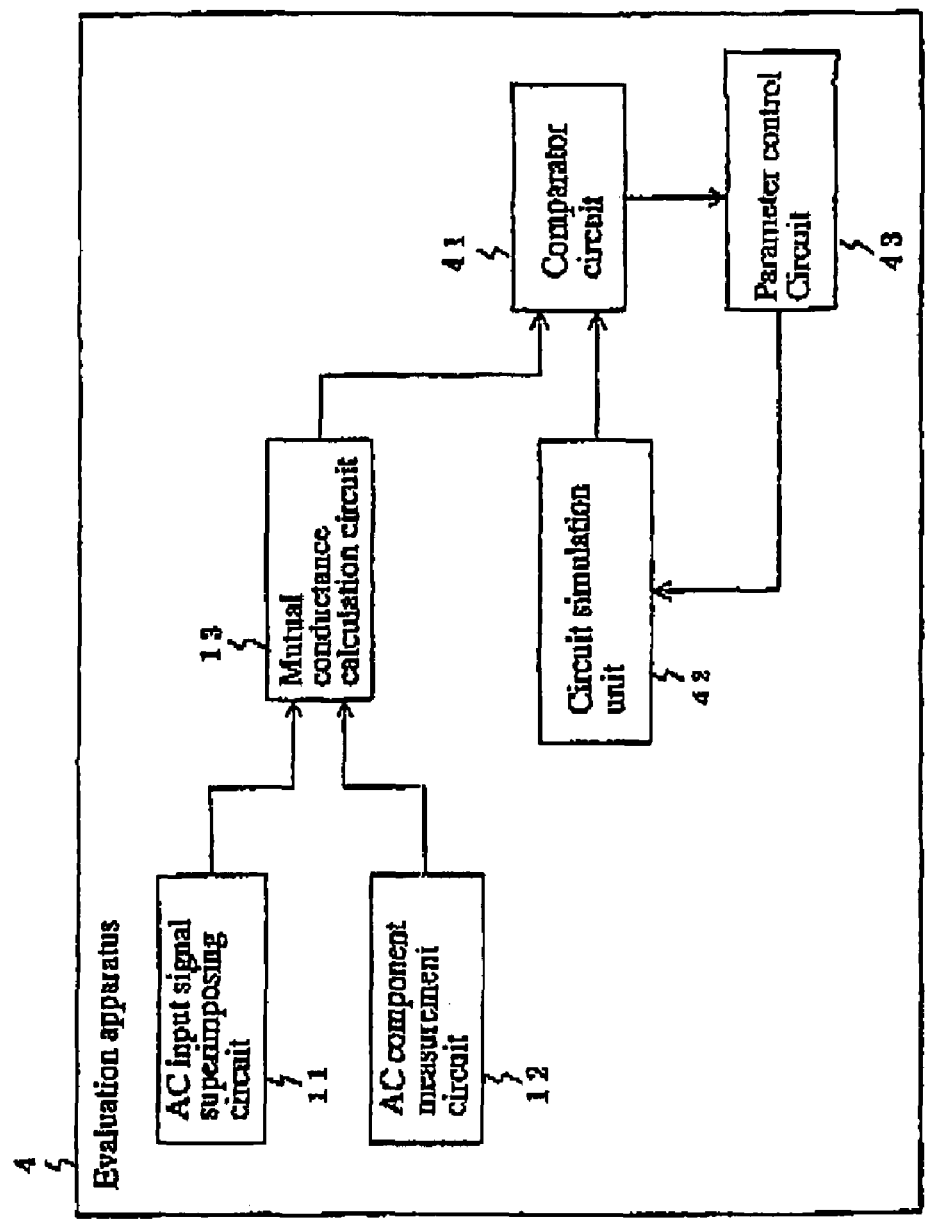
FIG. 12 is a block diagram showing a configuration of an evaluation apparatus according to the fourth embodiment of the present invention.

FIG. 12 is a block diagram showing a configuration of an evaluation apparatus according to a fourth embodiment of the present invention. In FIG. 12, evaluation apparatus 4 according to the fourth embodiment of the present invention has a similar configuration to evaluation apparatus 3 according to the third embodiment of the present invention except adding comparator circuit 41, circuit simulation unit 42, and parameter control circuit 43, and it has the same symbol as evaluation apparatus 3 for the identical configuration element.

Figure 13:
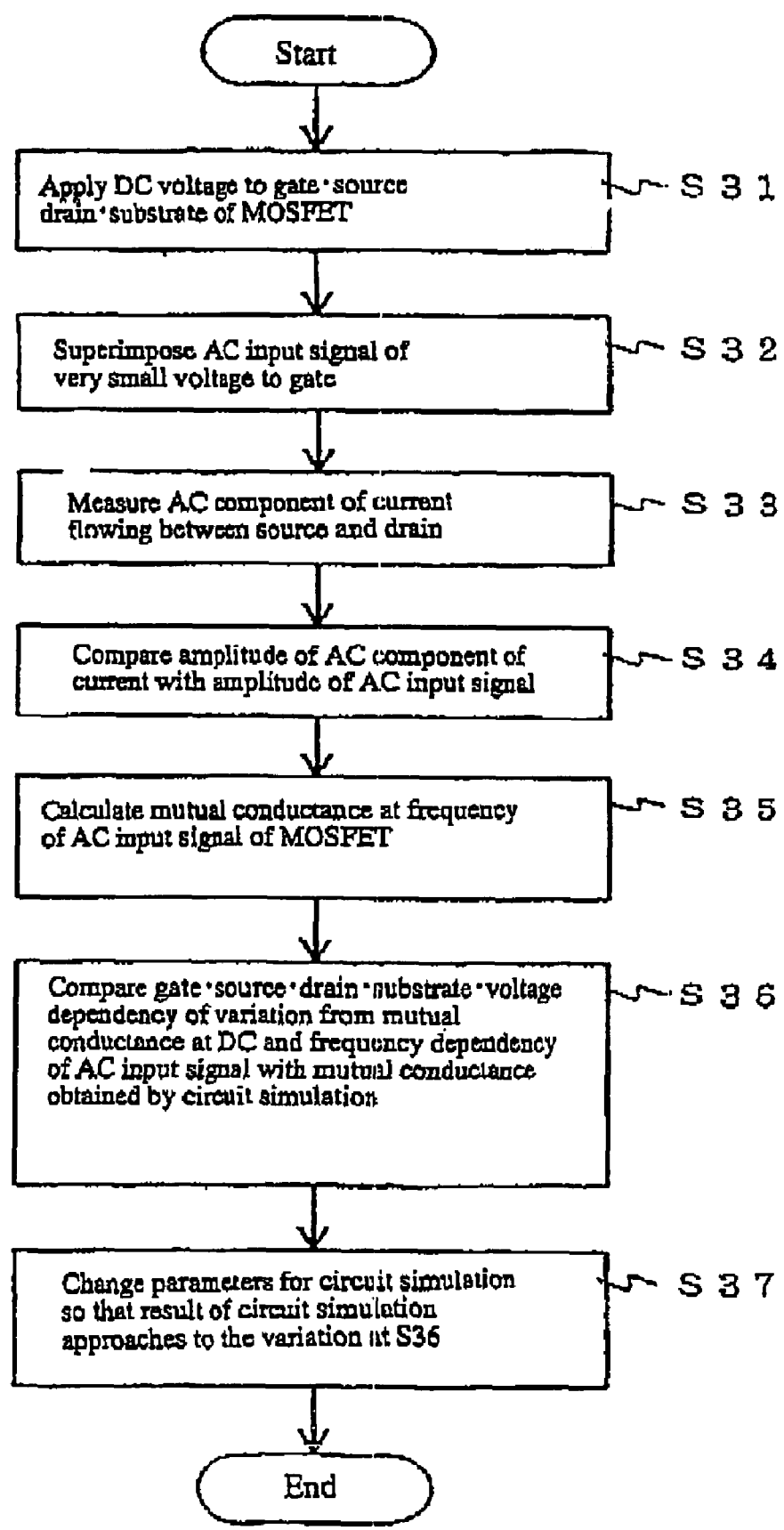
FIG. 13 is a flowchart showing an operation of the evaluation apparatus according to the fourth embodiment of the present invention.

FIG. 13 is a flowchart showing an operation of the evaluation apparatus according to the fourth embodiment of the present invention. The operation of evaluation apparatus 4 according to the fourth embodiment of the present invention will be explained by referring to FIG. 12 and FIG. 13.

In evaluation apparatus 4, AC input signal superimposing circuit 11 applies a DC voltage (step S31 in FIG. 13) to a gate•source•drain•substrate of a MOSFET, and also superimposes an AC input signal of small voltage to the gate (step S32 in FIG. 13).

AC component measurement circuit 12 measures an AC component of a current flowing between the source and the drain at the time (step S33 in FIG. 13), and mutual conductance calculation circuit 13 compares amplitude of the AC component of the current with amplitude of the AC input signal (step S34 in FIG. 13). From a ratio of the above comparison, a mutual conductance at a frequency of the AC input signal of the MOSFET is calculated (step S35 in FIG. 13).

Comparator circuit 41 compares a variation from a mutual conductance at DC, that is, a gate•source•drain•substrate dependency of a frequency characteristic of the mutual conductance, with the gate•source•drain•substrate dependency of a frequency characteristic of the mutual conductance which is obtained by a circuit simulation using circuit simulation unit 42 (step S36 in FIG. 13).

Parameter control circuit 43 changes a parameter for using a circuit simulation with circuit simulation unit 42, so that a frequency characteristic of the mutual conductance obtained as a result of the circuit simulation approaches to a frequency characteristic of the mutual conductance obtained from a measurement result of the MOSFET (step S37 in FIG. 13).

Figure 14:
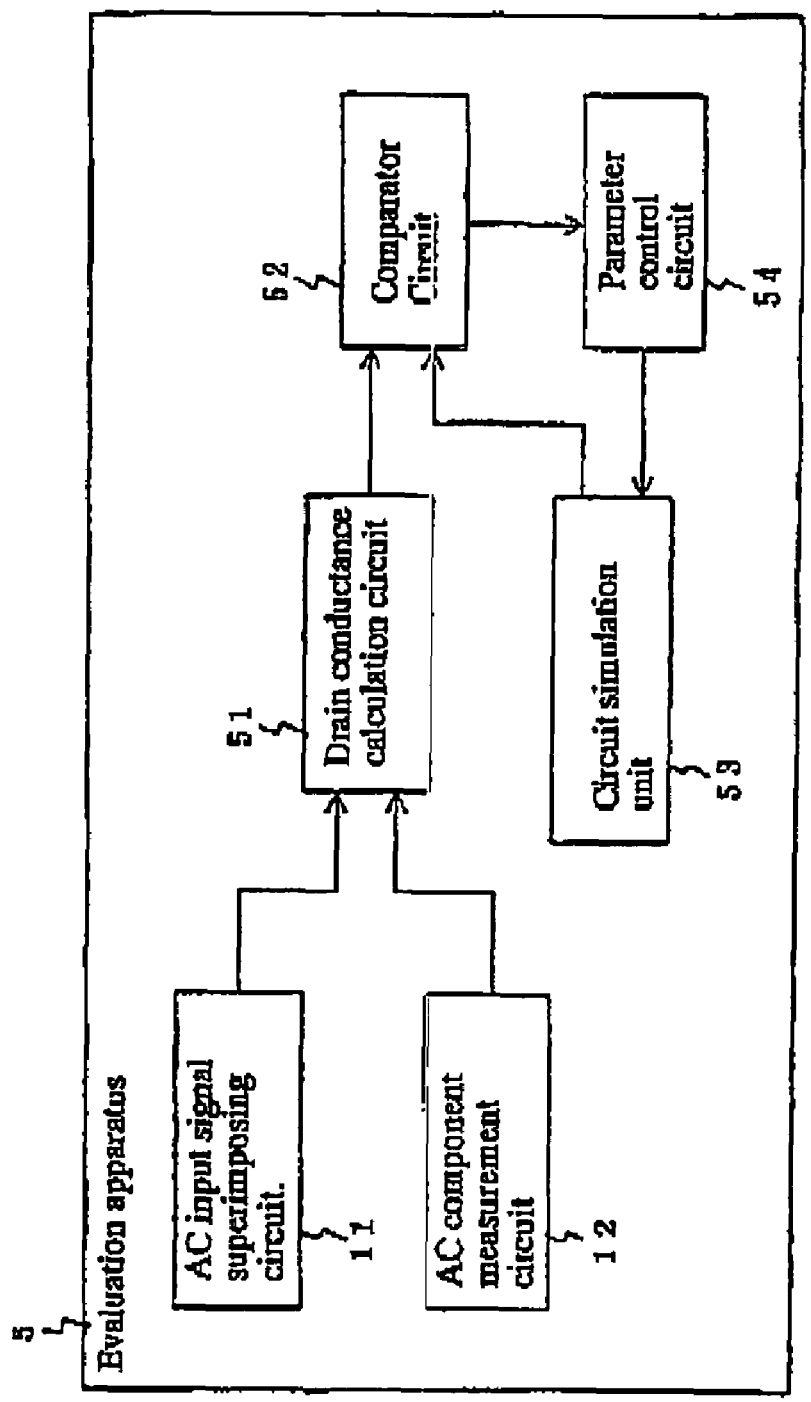
FIG. 14 is a block diagram showing a configuration of an evaluation apparatus according to the fifth embodiment of the present invention.

FIG. 14 is a block diagram showing a configuration of an evaluation apparatus according to a fifth embodiment of the present invention. In FIG. 14, evaluation apparatus 5 according to the fifth embodiment of the present invention has a similar configuration to evaluation apparatus 1 according to the first embodiment of the present invention shown in FIG. 3, except disposing drain conductance calculation circuit 51 instead of mutual conductance calculation circuit 13 and adding drain comparator circuit 52, circuit simulation unit 53, and parameter control circuit 54, and it has the same symbol as evaluation apparatus 1 for the identical configuration element.

Figure 15:
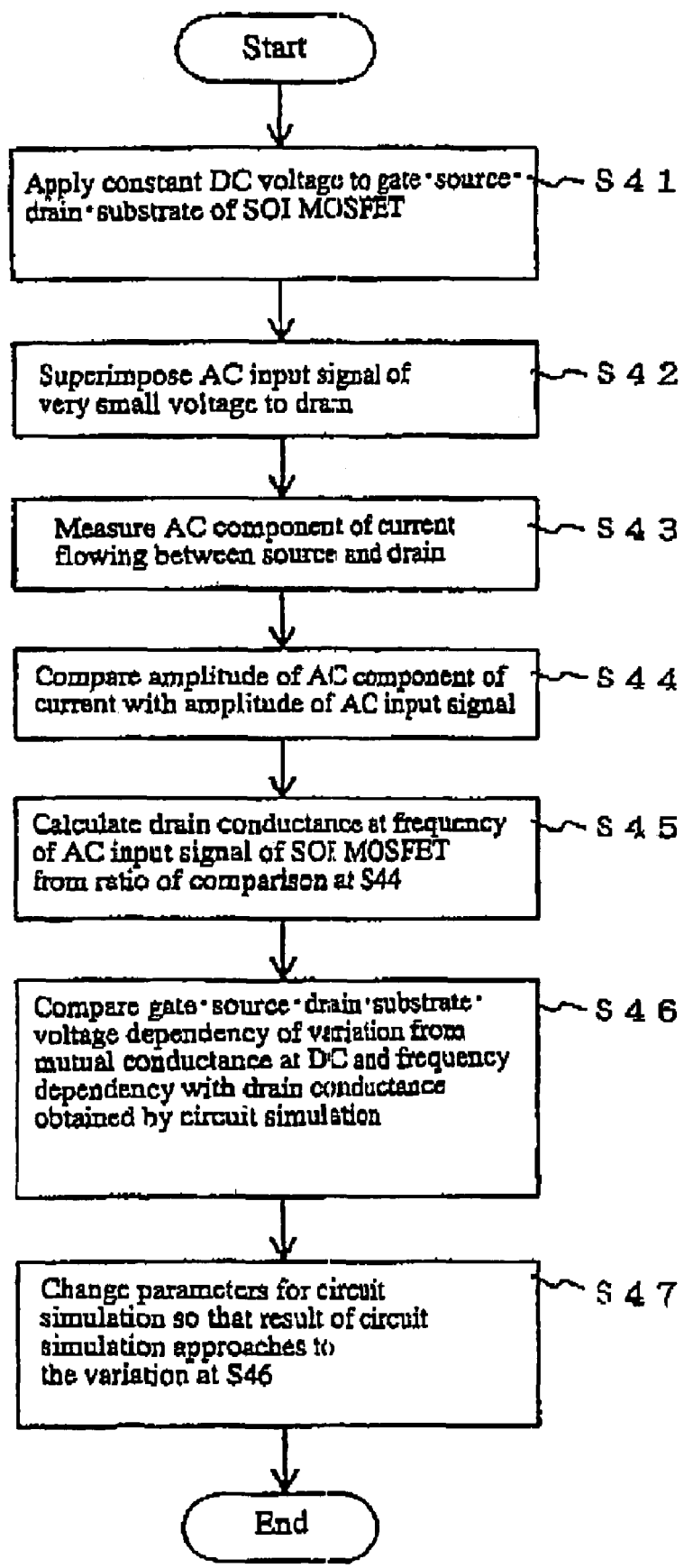
FIG. 15 is a flowchart showing operation of an evaluation apparatus according to the fifth embodiment of the present invention.

FIG. 15 is a flowchart showing an operation of the evaluation apparatus according to the fifth embodiment of the present invention. The operation of evaluation apparatus 5 according to the fifth embodiment of the present invention will be explained by referring to FIG. 14 and FIG. 15.

In evaluation apparatus 5, AC input signal superimposing circuit 11 applies a DC voltage (step S41 in FIG. 15) to a gate•source•drain•substrate of a MOSFET, and also superimposes an AC input signal of small voltage to the gate (step S42 in FIG. 15).

AC component measurement circuit 12 measures an AC component of a current flowing between the source and the drain at the time (step S43 in FIG. 15), and drain conductance calculation circuit 51 compares amplitude of the AC component of the current with amplitude of the AC input signal (step S44 in FIG. 15). From a ratio of the above comparison, a drain conductance at a frequency of the AC input signal of the MOSFET is calculated (step S45 in FIG. 15).

Comparator circuit 52 compares a gate•source•drain•substrate dependency of a frequency characteristic of the drain conductance obtained from drain conductance calculation circuit 51 as a measurement result of the MOSFET with the gate•source•drain•substrate dependency of a frequency characteristic of the drain conductance obtained by a circuit simulation with circuit simulation unit 52 (step S46 in FIG. 15).

Parameter control circuit 54 changes a parameter for using a circuit simulation with circuit simulation unit 53, so that a frequency characteristic of the drain conductance obtained as a result of the circuit simulation approaches to a frequency characteristic of the drain conductance obtained from a measurement result of the MOSFET (step S47 in FIG. 15).

Figure 16:
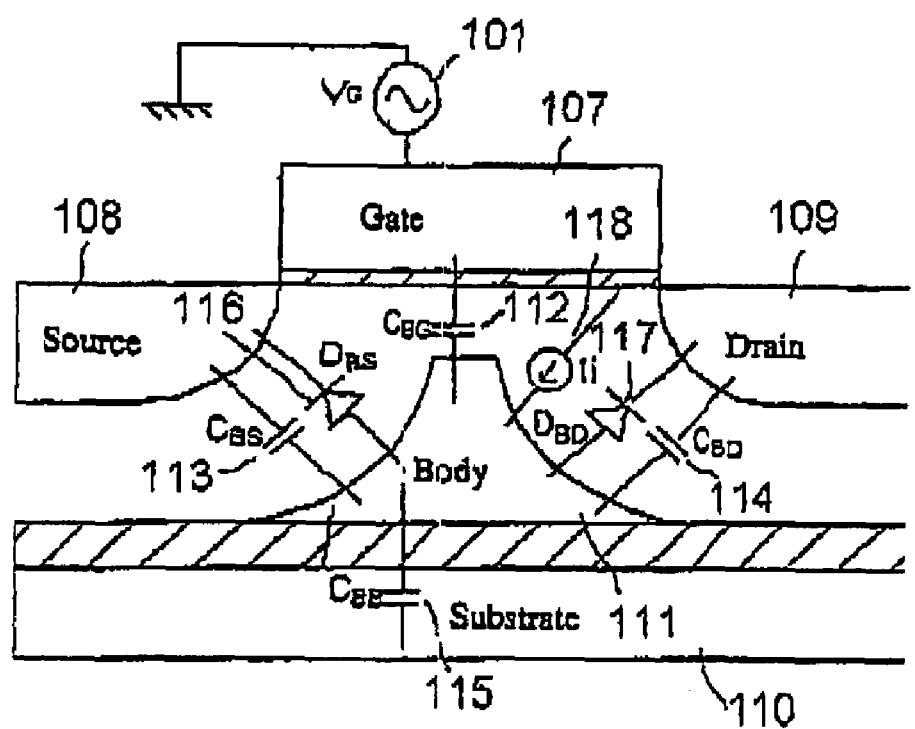
FIG. 16 is a partial traverse cross sectional view schematically showing resistors and capacitances around a body of a MOSFET.

FIG. 16 is a partial traverse cross sectional view schematically showing resistors and capacitances around a body of a MOSFET. In FIG. 16, gate electrode 107, source electrode 108, drain electrode 109, capacitance $C_{BG}$112 between substrate electrode 110 (body-gate capacitance), $C_{BS}$113 (body-source capacitance), $C_{BD}$114 (body-drain capacitance), and $C_{BB}$115 (body-substrate capacitance) exist around the body of SOI MOSFET.

In addition, p-n junctions between body 111 and the source electrode 108•the drain electrode 109 are expressed as a diode $D_{BS}$116 (body-source diode) and a diode $D_{BD}$117 (body-drain diode) respectively, and also a current caused by impact ionization in the channel is expressed as a current source (Ii) 118.

A SPICE parameter which is used for conventional SOI MOSFET circuit design is extracted from a current measurement between the source and drain at DC and a current flowing in a SOI body. However, it is difficult to correctly simulate a dynamic voltage change of the body with the above method.

On the other hand, in the present invention, the parameter is extracted using a frequency dependency of a mutual conductance as shown in FIG. 8.

With this method, a dynamic voltage change of body 111, that is, a dynamic change of the I-V characteristic of the SOI can be simulated correctly. Parameters which can be extracted with this method are a resistance of p-n junction and an impact ionization current from a DC current component flowing in the body 111, and a capacitance component relating to the body 111 from a frequency dependency of the mutual conductance gm.

Regarding a SOI MOSFET, it is known in general that the I-V characteristic changes according to temperature rise of the MOSFET due to heat generation by a current flowing in the MOSFET. The heat generation also effects on the mutual conductance measurement of the present invention. However, the heat generation in the present invention can be suppressed by making a current which flows in the MOSFET small by applying a low gate voltage which is within ±0.5 V of the threshold voltage. Therefore, the effect of the heat on the mutual conductance measurement can be reduced.

Figure 1:
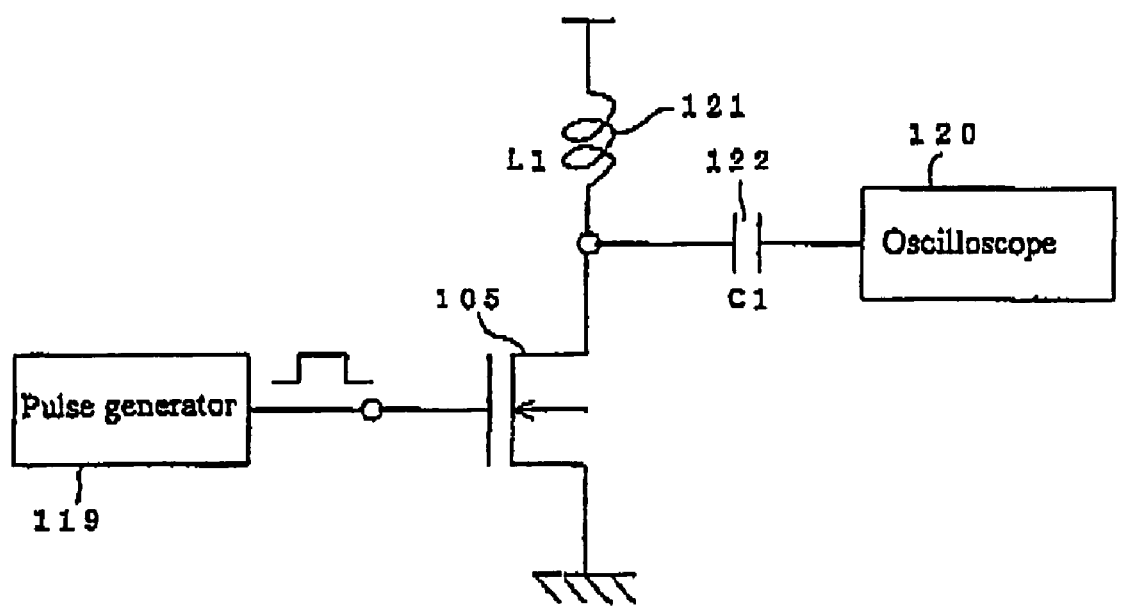
FIG. 1 is a schematic diagram showing a measurement method of a conventional pulse measurement method.
Figure 2:
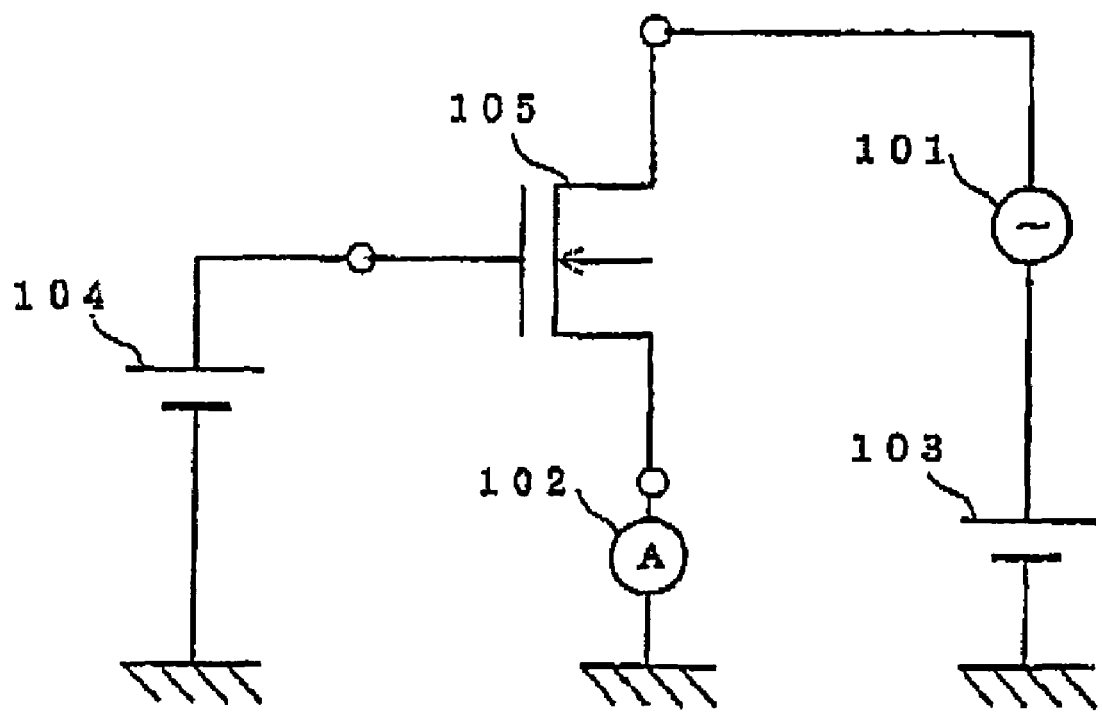
FIG. 2 is a schematic diagram showing a measurement method of a conventional drain conductance method.

A measurement method of the conventional drain conductance method is shown in FIG. 2. As shown in FIG. 2, in the conventional measurement method, a voltage source connecting AC voltage source 101 and DC voltage source 103 in series is connected to the drain terminal of MOSFET 105, and a terminal on the opposite side of the voltage source is connected to the ground, while applying a constant voltage to the gate terminal of MOSFET 105, which is nMOS or pMOS, using DC voltage source 104.

In addition, in the conventional measurement method, an input terminal of AC current meter 102 is connected to the source terminal of MOSFET 105, and a terminal on the opposite side of AC current meter 102 is connected to the ground. With the above configuration, if a ratio of measurement value of AC current meter 102 and amplitude of AC voltage source 101 is calculated, the value of the ratio constitutes a drain conductance of MOSFET 105 at a frequency of the AC signal.

In this drain conductance method, if amplitude of AC voltage source is denoted $V_D$, and if amplitude of AC current meter 102 is denoted $I_S$, the drain conductance $g_D$ of MOSFET 105 at a frequency f of AC voltage source 101 is given by formula (5).

$$g_D(f)=I_S/V_D \quad (5)$$

Figure 17:
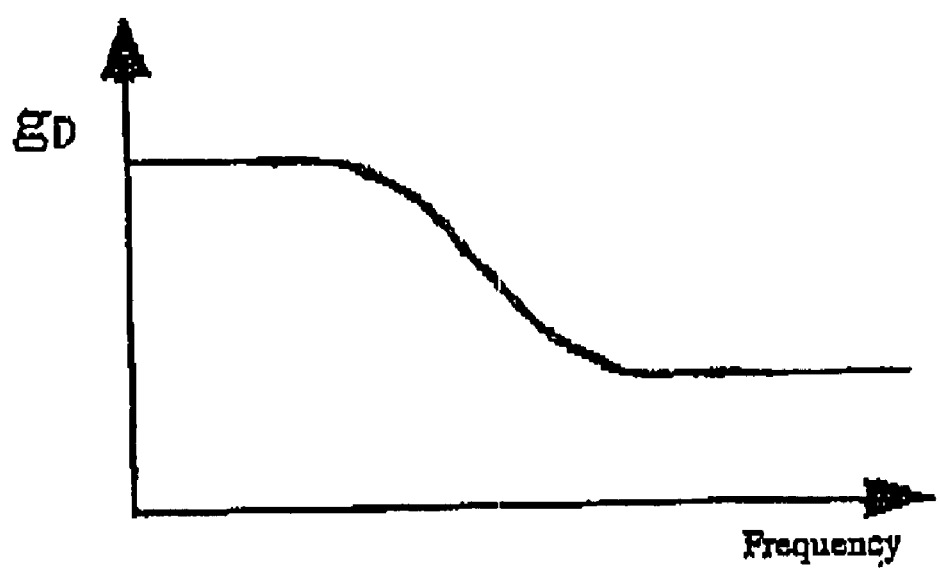
FIG. 17 is a figure showing one example of a frequency dependency of a drain conductance $g_D$.

A frequency dependency of the drain conductance $g_D$ at this time becomes, as shown in FIG. 17, a constant value against frequency at low frequency region, increases or decreases at a specific frequency region with increase in the frequency, and becomes to be a constant value again at a frequency higher than the specific frequency region.

A change of the drain conductance $g_D$ of the SOI MOSFET, as shown in FIG. 17, is due to a change of the SOI body voltage in conjunction with a change of gate voltage.

From a frequency dependency of the drain conductance $g_D$, amplitude of the body voltage is calculated by formula (6).

$$V_{BODY}(f)=\{[g_D(f)-g_D\text{fix}]/gm \text{ fix} \times K_{BODY}\} \times V_G \quad (6)$$

In formula (6), $g_D$ fix is a drain conductance $g_D$ when the body voltage is fixed, and gm fix is a mutual conductance when the body voltage is fixed.

A SPICE parameter which is used for a circuit design of a conventional SOI MOSFET is extracted using a current measurement between the source and the drain at DC and a current flowing in a SOI body. However, it is difficult to correctly simulate a dynamic voltage change of the body with the above method.

On the other hand, in the present invention, the parameter is extracted using a frequency dependency of a drain conductance $g_D$ as shown in FIG. 17. With this, a dynamic voltage change of the body, that is, a dynamic change of the I-V characteristic of the SOI can be correctly simulated. Parameters which can be extracted with this method are a resistance of p-n junction and an impact ionization current from a DC current component flowing in the body 111, and a capacitance component relating to the body 111 from a frequency dependency of the drain conductance $g_D$.

A DC characteristic of the body voltage of a SOI MOSFET is greatly influenced by impact ionization current in general. Therefore, in the change shown in FIG. 17, the drain conductance $g_D$ at low frequency has a value that is shifted just by an impact ionization effect from a drain conductance $g_D$ when the body-voltage is fixed.

On the contrary, in the change shown in FIG. 17, the effect of the impact ionization current becomes small at high frequency region, and instead of this, effect of capacitances between the body 111 and gate 107, source 108, drain 109 and substrate 110 become large. That is, a difference between a drain conductance $g_D$ at low frequency region and a drain conductance $g_D$ at high frequency region shown in FIG. 17 is a difference between the effect of impact ionization and the effect of the capacitances. Therefore, it is impossible to take out each effect separately from a value of the difference.

In the above-described each embodiment, the measurement is conducted with low voltage within ±0.5 V for the voltage between the source and the drain. With this condition, in each embodiment of the present invention, the impact ionization current becomes small, thereby enabling to reduce the effect of the impact ionization. Therefore, only effect of a capacitance can be taken out from the difference between the drain conductance $g_D$ at low frequency region and the drain conductance $g_D$ at high frequency region.

Meanwhile, the evaluation apparatuses 1, 2, 3, and 4 according to the embodiments of the first to the fourth of the present invention calculated a mutual conductance. On the other hand, the evaluation apparatuses 5 according to the fifth embodiment of the present invention calculated a drain conductance. For example, as an example of modification of the evaluation apparatus 3 according to the third embodiment of the present invention, it is possible to dispose a drain conductance calculation circuit instead of a mutual conductance calculation circuit 13. In this case, the step 24 to the step 26 shown in FIG. 11 will be as follows.

The drain conductance calculation circuit compares amplitude of AC component of a current with amplitude of an AC input signal (corresponds to step 24 in FIG. 11), and from a ratio of this comparison, calculates the drain conductance at a frequency of the AC input signal of the MOSFET (corresponds to step 25 in FIG. 11). AC component amplitude calculation circuit 31 compares a drain conductance at a frequency of the AC input signal with a drain conductance of a SOI MOSFET at DC (corresponds to step 26 in FIG. 11), and from a ratio of this comparison and a relation between a body voltage of the SOI MOSFET and a threshold value, calculates amplitude of AC component of the body voltage under condition of the AC input signal is being inputted (corresponds to step 27 in FIG. 11).

In addition, the evaluation apparatuses 1, 2, 3, 4 and 5 according to the embodiments of the first to the fifth of the present invention superimpose the AC input signal to the gate, while applying a DC voltage on the gate, the source, the drain, and the substrate. However, the DC voltage application to the substrate is not essential. When there is no problem even if the substrate is electrically floating, the AC input signal may be superimposed to the gate, while applying a DC voltage only to the gate, the source, and the drain.

As described in the above, in the present invention, the I-V characteristic at AC operation of MOSFET 105 can be measured accurately. In addition, in the present invention, from the I-V characteristic, a behavior of the body voltage of a SOI MOSFET at AC operation can be known. Furthermore, in the present invention, by fitting SPICE parameters to the measured I-V characteristic at AC operation, parameters capable of correctly simulating a change of dynamic I-V characteristic can be obtained.

As explained in the above, the present invention provides advantages such that when an AC input signal of small voltage is superimposed to the gate, while applying a DC voltage to the gate•source•drain•substrate, an AC component of a current flowing between the source and drain is measured, and by calculating a mutual conductance at a frequency of the AC input signal of a MOSFET from a ratio of amplitude of the measured AC component and amplitude of the AC input signal, the I-V characteristic at AC operation of the MOSFET can be measured accurately.

POSSIBILITY FOR INDUSTRIAL APPLICATION

The evaluation apparatus, and the method of circuit design and the circuit design system for the apparatus are applicable to a MOSFET, especially to a SOI MOSFET, and no limitation is there in the possibility of their applications.

While the present invention has been described by associating with some preferred embodiments and examples, it is to be understood that these embodiments and examples are merely for illustrative of the invention by an example, and not restrictive. While it will be obvious to those skilled in the art that various changes and substitutions bar equivalent components and techniques are eased upon reading the specification, it is believed obvious that such changes and substitutions fit into the true scope and spirit.

What is claimed is:

1. An evaluation apparatus, comprising:
   an AC input signal superimposing circuit for superimposing an AC input signal to a gate of a MOSFET (Metal Oxide Semiconductor Field Effect Transistor);
   an AC component measurement circuit for measuring an AC component of a current flowing between a source and a drain of the MOSFET when the AC input signal is superimposed to the gate; and
   a mutual conductance calculation circuit for calculating a mutual conductance at a frequency of the AC input signal of the MOSFET from a ratio of amplitude of an AC component of a measured current and amplitude of the AC input signal,
   wherein the gate, the source, and the drain of the MOSFET are being applied a DC voltage.

2. An evaluation apparatus according to claim 1, wherein the MOSFET is a SOI (Silicon On Insulator) MOSFET having a SOT structure.

3. An evaluation apparatus according to claim 1, further comprising:
   a drain current calculation circuit for calculating a drain current at a frequency of the AC input signal by measuring the mutual conductance by sweeping a gate voltage and integrating the mutual conductance by the gate voltage.

4. An evaluation apparatus according to claim 2, further comprising:
   an AC component amplitude calculation circuit for calculating an amplitude of an AC component of a body voltage from a mutual conductance of the SOT MOSFET at a frequency of the AC input signal, a mutual conductance of the SOI MOSFET at DC, a dependency of threshold voltage on a body voltage of the SOT MOSFET, and DC gate voltage.

5. An evaluation apparatus according to claim 1, further comprising:
   a circuit simulation unit for simulating the SOT MOSFET;
   a comparator circuit for comparing a gate•source•drain voltage dependency of a frequency characteristic of the mutual conductance obtained from the mutual conductance calculation circuit as a result of measurement of the MOSFET with a gate•source•drain voltage dependency of a frequency characteristic of the mutual conductance obtained as a result of circuit simulation for simulating the MOSFET; and
   a parameter control circuit for changing a parameter which is used for the circuit simulation so that a frequency characteristic of the mutual conductance obtained as a result of the circuit simulation approaches to a frequency characteristic of the mutual conductance obtained from a result of measurement of the MOSFET.

6. An evaluation apparatus according to claim 1, wherein the calculation of the mutual conductance is conducted under a bias condition that the gate voltage is within ±0.5 V of a threshold value of the MOSFET.

7. An evaluation apparatus according to claim 1, wherein the AC input signal superimposing circuit superimposes the AC input signal to the gate under a condition of applying the DC voltage to the substrate as well as the gate, the source, and the drain.

8. An evaluation apparatus, comprising:
   an AC input signal superimposing circuit for superimposing an AC input signal to a drain of a SOT (Silicon On Insulator) MOSFET (Metal Oxide Semiconductor Field Effect Transistor);
   an AC component measurement circuit for measuring an AC component of a current flowing between a source and a drain of the S01 MOSFET when the AC input signal is superimposed to the drain; and
   a drain conductance calculation circuit for calculating a drain conductance at a frequency of the AC input signal of the SOT MOSFET from a ratio of amplitude of an AC component of a measured current and amplitude of the AC input signal,
   wherein the gate, the source, and the drain of the SOT MOSFET are being applied a DC voltage.

9. An evaluation apparatus according to claim 8, further comprising:
   an AC component amplitude calculation circuit for calculating amplitude of an AC component of a body voltage from a drain conductance at a frequency of the AC input signal, a drain conductance at DC, a dependency of threshold voltage on a body voltage of the SOT MOSFET, and DC drain voltage.

10. An evaluation apparatus according to claim 8, further comprising:
a circuit simulation unit for simulating the SOI MOSFET;
a comparator circuit for comparing a gate•source•drain voltage dependency of a frequency characteristic of the drain conductance obtained from the drain conductance calculation circuit as a result of measurement of the MOSFET with a gate•source•drain voltage dependency of a frequency characteristic of the drain conductance obtained as a result of circuit simulation for simulating the MOSFET; and
a parameter control circuit for changing a parameter which is used for the circuit simulation so that a frequency characteristic of the drain conductance obtained as a result of the circuit simulation approaches to a frequency characteristic of the drain conductance obtained from a result of measurement of the MOSFET.

11. An evaluation apparatus according to claim 8, wherein the calculation of the drain conductance is conducted under a bias condition that an absolute value of the gate voltage is within 0.5 V of a threshold value of the MOSFET.

12. An evaluation apparatus according to claim 8, wherein the AC input signal superimposing circuit superimposes the AC input signal to the gate under a condition of applying the DC voltage to the substrate as well as the gate, the source, and the drain.

13. A circuit design method, comprising steps of:
a step for superimposing an AC input signal to a gate of a MOSFET (Metal Oxide Semiconductor Field Effect Transistor);
a step for measuring an AC component of a current flowing between a source and a drain of the MOSFET when the AC input signal is superimposed to the gate;
a step for calculating a mutual conductance at a frequency of the AC input signal of the MOSFET from a ratio of amplitude of an AC component of a measured current and amplitude of the AC input signal;
a step for comparing a gate.source.drain voltage dependency of a frequency characteristic of the mutual conductance obtained as a result of measurement of the MOSFET with a gate•source•drain voltage dependency of a frequency characteristic of the mutual conductance obtained from circuit simulation for simulating the MOSFET; and
a step for changing a parameter which is used for the circuit simulation so that a frequency characteristic of the mutual conductance obtained as a result of the circuit simulation approaches to a frequency characteristic of the mutual conductance obtained from a result of measurement of the MOSFET,
wherein the gate, the source, and the drain of the MOSFET are being applied a DC voltage.

14. A circuit design method according to claim 13, wherein the MOSFET is a SCI (Silicon On Insulator) MOSFET having a SQl structure.

15. A circuit design method according to claim 13, wherein the parameter is at least one of capacitances and resistors between a body of the MOSFET and the gate•source•drain.

16. A circuit design method according to claim 13, wherein the step for superimposing the AC input signal superimposes the AC input signal to the gate under a condition of applying the DC voltage to the substrate as well as the gate, the source, and the drain.

17. A circuit design method, comprising steps of:
a step for superimposing an AC input signal to a drain of a SOI (Silicon On Insulator) MOSFET (Metal Oxide Semiconductor Field Effect Transistor);
a step for measuring an AC component of a current flowing between a source and a drain of the SOT MOSFET when the AC input signal is superimposed to the drain;
a step for calculating a drain conductance at a frequency of the AC input signal of the SOT MOSFET from a ratio of amplitude of an AC component of a measured current and amplitude of the AC input signal;
a step for comparing a gate•source•drain voltage dependency of a frequency characteristic of the drain conductance obtained as a result of measurement of the MOSFET with a gate•source•drain voltage dependency of a frequency characteristic of the drain conductance obtained from circuit simulation for simulating the SOI MOSFET; and
a step for changing a parameter which is used for the circuit simulation so that a frequency characteristic of the drain conductance obtained as a result of the circuit simulation approaches to a frequency characteristic of the drain conductance obtained from a measurement result of the MOSFET,
wherein the gate, the source, and the drain of the SOI MOSFET are being applied a DC voltage.

18. A circuit design method according to claim 17, wherein the parameter is at least one of capacitances and resistors between a body of the SOI MOSFET and the gate•source•drain•substrate.

19. A circuit design method according to claim 17, wherein the step for superimposing the AC input signal superimposes the AC input signal to the gate under a condition of applying the DC voltage to the substrate as well as the gate, the source, and the drain.

20. A circuit design system, comprising:
a function block for superimposing an AC input signal to a gate of a MOSFET (Metal Oxide Semiconductor Field Effect Transistor);
a function block for measuring an AC component of a current flowing between a source and a drain of the MOSFET when the AC input signal is superimposed to the gate;
a function block for calculating a mutual conductance at a frequency of the AC input signal of the MOSFET from a ratio of amplitude of an AC component of a measured current and amplitude of the AC input signal;
a function block for comparing a gate•source•drain voltage dependency of a frequency characteristic of the mutual conductance obtained as a result of measurement of the MOSFET with a gate•source•drain voltage dependency of a frequency characteristic of the mutual conductance obtained from circuit simulation for simulating the MOSFET; and
a function block for changing a parameter which is used for the circuit simulation so that a frequency characteristic of the mutual conductance obtained as a result of the circuit simulation approaches to a frequency characteristic of the mutual conductance obtained from a result of measurement of the MOSFET,
wherein the gate, the source, and the drain of the MOSFET are being applied a DC voltage.

21. A circuit design system according to claim 20, wherein the MOSFET is a SOI MOSFET having a SOI (Silicon On Insulator) structure.

22. A circuit design system according to claim 20, wherein the parameter is at least one of capacitances and resistors between a body of the MOSFET and the gate•source•drain•substrate.

23. A circuit design system according to claim 20, wherein the function block for superimposing the AC input signal superimposes the AC input signal to the gate under a condition of applying the DC voltage to the substrate as well as the gate, the source, and the drain.

24. A circuit design system, comprising:
- a function block for superimposing an AC input signal to a drain of a SOI (Silicon On Insulator) MOSFET (Metal Oxide Semiconductor Field Effect Transistor);
- a function block for measuring an AC component of a current flowing between a source and a drain of the SOI MOSFET when the AC input signal is superimposed to the drain;
- a function block for calculating a drain conductance at a frequency of the AC input signal of the SOI MOSFET from a ratio of amplitude of an AC component of the measured current and amplitude of the AC input signal;
- a function block for comparing a gate•source•drain voltage dependency of a frequency characteristic of the drain conductance obtained as a result of measurement of the MOSFET with a gate•source•drain voltage dependency of a frequency characteristic of the drain conductance obtained by circuit simulation for simulating the SOI MOSFET; and
- a function block for changing a parameter which is used for the circuit simulation so that a frequency characteristic of the drain conductance obtained as a result of the circuit simulation approaches to a frequency characteristic of the drain conductance obtained from a result of measurement of the MOSFET,
- wherein the gate, the source, and the drain of the SOI MOSFET are being applied a DC voltage.

25. A circuit design system according to claim 24, wherein the parameter is at least one of capacitances and resistors between a body of the SOI MOSFET and the gate•source•drain•substrate.

26. A circuit design system according to claim 24, wherein the function block for superimposing the AC input signal superimposes the AC input signal to the gate under a condition of applying the DC voltage to the substrate as well as the gate, the source, and the drain.

* * * * *